United States Patent [19]

Meshkat et al.

[11] Patent Number: 4,933,889
[45] Date of Patent: Jun. 12, 1990

[54] METHOD FOR FINE DECOMPOSITION IN FINITE ELEMENT MESH GENERATION

[75] Inventors: Siavash N. Meshkat, San Jose, Calif.; Lee R. Nackman, White Plains; Vijay Srinivasan, Peekskill, both of N.Y.

[73] Assignee: International Business Machines Corporation, Armonk, N.Y.

[21] Appl. No.: 187,715

[22] Filed: Apr. 29, 1988

[51] Int. Cl.⁵ ............. G06F 15/60; G06F 15/62; G06F 15/328
[52] U.S. Cl. .................... 364/578; 364/522; 364/505
[58] Field of Search .......... 364/300, 505, 522, 578, 364/505; 382/25, 26

[56] References Cited

U.S. PATENT DOCUMENTS

| | | | |
|---|---|---|---|
| 3,805,028 | 4/1974 | Morton | 382/26 |
| 3,939,336 | 2/1976 | Vasiliev et al. | 364/578 |
| 3,976,827 | 8/1976 | Alien et al. | 382/26 |
| 4,183,013 | 1/1980 | Agrawala et al. | 382/26 |
| 4,192,004 | 3/1980 | Buerger | 382/26 |
| 4,361,830 | 11/1982 | Honma et al. | 382/25 |
| 4,404,684 | 9/1983 | Takada | 382/25 |
| 4,797,842 | 1/1989 | Nackman et al. | 364/578 |

OTHER PUBLICATIONS

V. Srinivasan et al., "Voronoi Diagram for Multiply-Connected Polygonal Domains I: Algorithm", IBM Journal of Research and Development, vol. 31, No. 3, May 1987, pp. 361-372.

S. N. Meskat et al., "Voronoi Diagram for Multiply-Connected Polygonal Domains II: Implementation and Application", IBM Journal of Research and Development, vol. 31, No. 3, May 1987, pp. 373-381.

O. C. Zienkiewicz, "The Finite Element Method", 3rd ed. (McGraw-Hill, 1982), pp. 93-118, 423-448, 607-624.

R. Sedgewick, "Algorithms", (Addison-Wesley, 1983), pp. 373-388.

Primary Examiner—Felix D. Gruber
Attorney, Agent, or Firm—Sughrue, Mion, Zinn, Macpeak & Seas

[57] ABSTRACT

A method for fine decomposition in finite element mesh generation, in which a polygonal boundary of a domain is input into the system by an analyst and the domain is automatically divided into rough elements generally corresponding to Voronoi regions, that is, regions which are closer to respective ones of the polygonal line segments or reflex vertices therebetween. Any arc portion of these regions is converted to a straight line. Additional lines are formed between interior vertices of the rough regions so that all rough regions are either triangles or trapezoids. Adjacent rough regions are then paired across internal boundaries and are classified into four types. The rough regions are then subdivided into fine regions of triangular shape according to rules associated with each of the four types. The degree of fine subdivision can be controlled according to known equations providing the total number of fine elements. Finite difference equations are solved on the so generated fine regions and a physical variable is displayed in pictorial form. The analyst then readjusts the domain boundary and repeats the process.

16 Claims, 7 Drawing Sheets

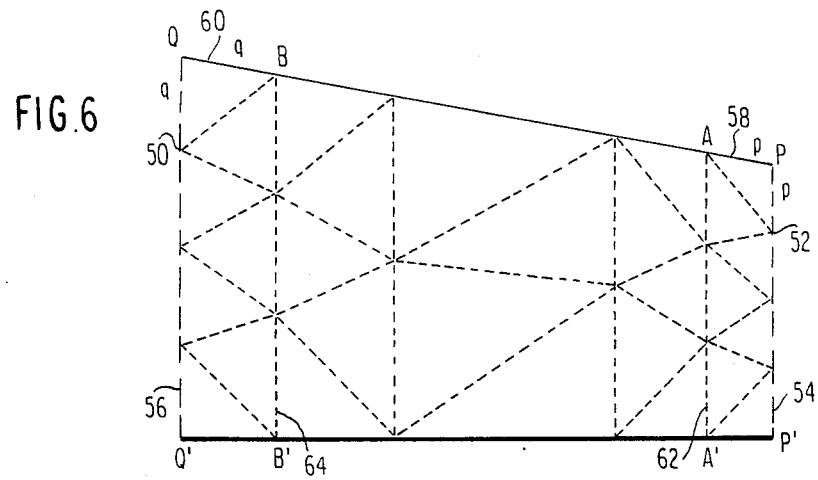
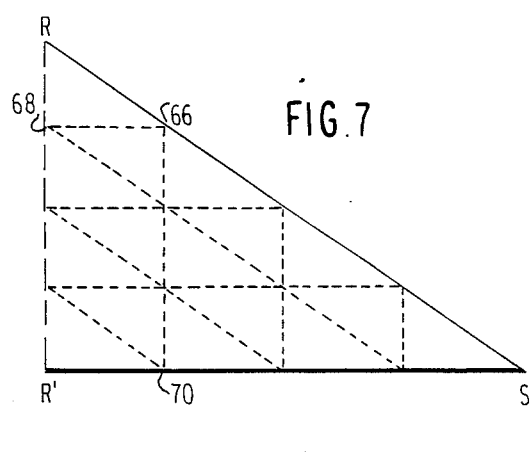
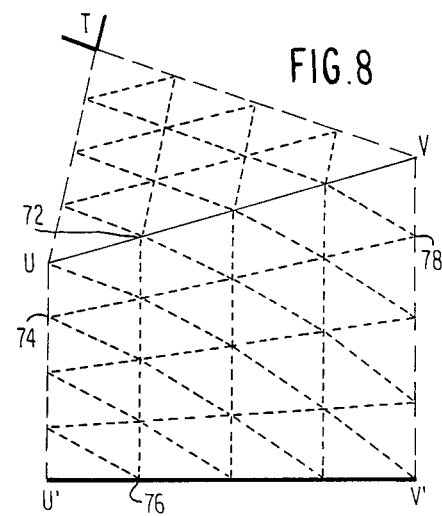
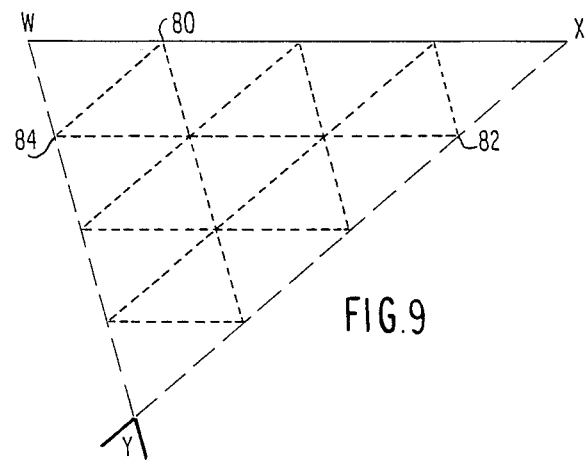

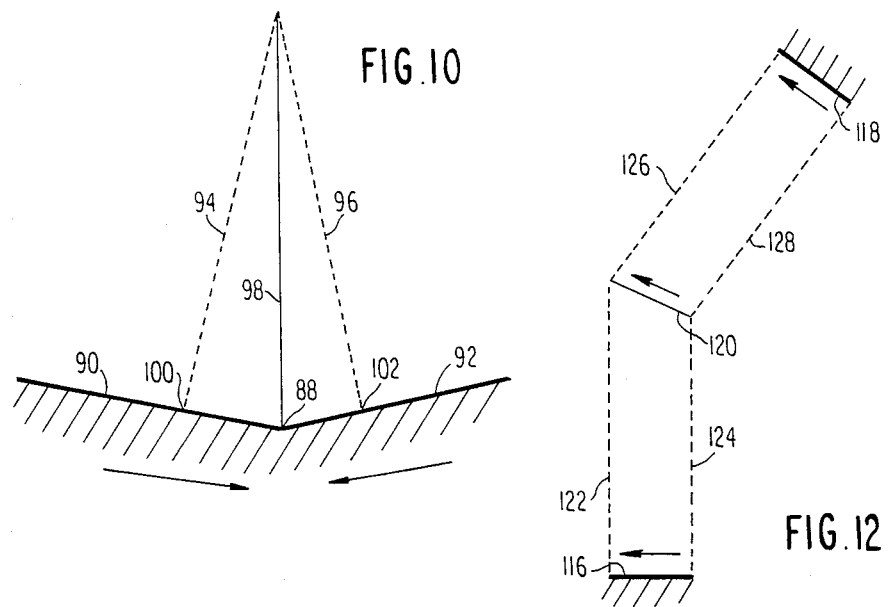
FIG.10
FIG.12
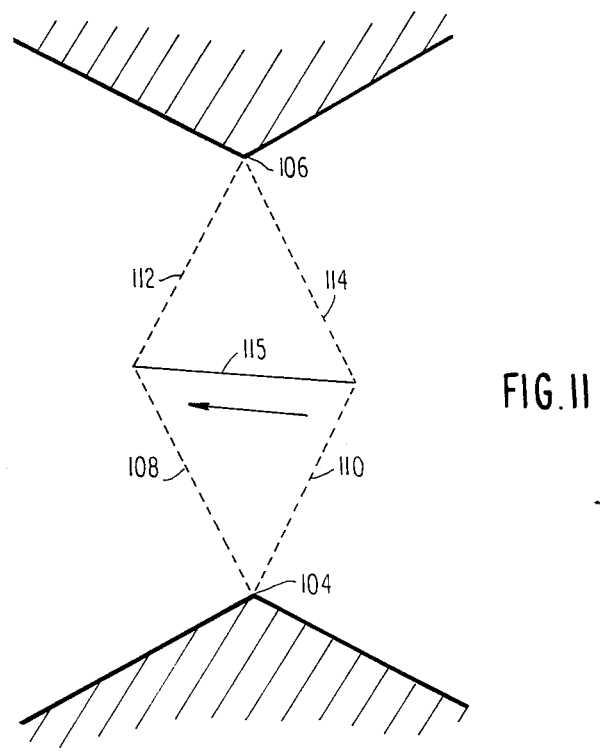
FIG.11

METHOD FOR FINE DECOMPOSITION IN FINITE ELEMENT MESH GENERATION

BACKGROUND OF THE INVENTION

1. Field of the Invention

The invention relates to computer modeling of physical objects by the manual inputting of shapes and the display of physical quantities. More particularly, the invention relates to generation of finite elements for representing the shape of the objects.

2. Background Art

Finite element modeling (FEM) is one of the most widely used computer aided engineering tools applied to solve engineering problems governed by partial differential equations. Such problems include heat transfer, stress and vibration analysis, diffusion, fluid flow, and electrical and magnetic fields. Finite element modeling is particularly important when the shapes of the objects to be modeled are relatively complex since the differential equations become increasingly difficult to solve or even to approximate.

In solving such an engineering problem by finite element modeling, there is an iterative interaction between the designer and the computer. First the shape of the physical object is defined, usually by the manual inputting of the outlines of the shape. Then, this shape is broken down into finite elements. Each finite element is small enough that the desired physical quantities can be approximated by suitable interpolating functions over a single finite element. Finally, one or more difference equations, which are a finite element form of the relevant set of partial differential equations, are solved by the computer based upon the generated finite elements. The results of the difference equations for one or more physical quantities are displayed. The user inspects these displayed quantities, adjusts the shape, and repeats the finite element generation and the difference equation solution in hopes of obtaining better results according to some criterion known to the user.

An important and time consuming part of finite element modeling is the decomposition of the problem domain (object shape) into the finite elements. It is important to automate this decomposition process for several reasons. Manual finite element generation is a tedious process prone to error if the shape is complex. Finite element generation is often the rate limiting step in which the designer proposes a design, analyzes it, and, based on the analysis, modifies it. As much as 80% of the analyst's time may be occupied with the generation of the finite elements. Therefore, automating the finite element generation improves the design cycle time. Also, a reliable, automatic finite element generator is a prerequisite for an automated design optimization system.

Finite elements are usually generated using a two step process. First, in a coarse decomposition, the object is partitioned into disjoint subdomains. Then, in a fine decomposition, each subdomain is further partitioned into finite elements. This invention is concerned with fine decomposition and is intended for use in conjunction with the general type of coarse decomposition disclosed by Nackman and Srinivasan, two of the present inventors, in U.S. patent application, Ser. No. 717,368, filed Mar. 25, 1985, now abandoned, and its continuation-in-part, Ser. No. 97,382, filed Sept. 16, 1987 and now U.S. Pat. No. 4,797,842 incorporated herein by reference.

The goal of finite element modeling is to obtain an approximate solution to a system of partial differential equations (with boundary and initial conditions) over some domain. The approach is to decompose the domain into subdomains, called elements, and then, using the idea of interpolation, to seek an approximate solution for the dependent variables. To ensure accuracy, the elements in regions in which the dependent variables change rapidly should be small and many. Such rapid changes occur: (1) in regions of rapid changes in geometrical shapes, e.g., near reentrant corners; (2) in regions of rapid changes in the boundary conditions, e.g., near a concentrated boundary heat source; and (3) in regions of rapid changes in material properties, e.g., at the interface between two bonded materials. On the other hand, for computational efficiency and, to a lesser extent, accuracy, the elements in regions in which the dependent variable changes slowly should be large and few.

The purpose of an automatic finite element generator is to decompose automatically a model of the shape of a physical object into a collection of elements that provides an appropriate balance between accuracy and efficiency. The set of boundaries between the generated finite elements is often referred to as a mesh. Mesh generation techniques have been surveyed by M. S. Shephard in a technical article entitled "Finite Element Modeling Within an Integrated Geometric Modeling Environment: Part I—Mesh Generation" appearing in Engineering with Computers, vol. 1, 1985 at pages 61-71.

Finite element generation schemes are classified here according to what user interaction is required. In a manual scheme, both coarse and fine decomposition require user interaction. In a semi-automatic scheme, the coarse decomposition requires user interaction, but the fine decomposition does not. In an automatic scheme, neither the fine nor the coarse decomposition requires user interaction other than the specification of a few parameters.

SUMMARY OF THE INVENTION

Accordingly, an object of the present invention is to provide automatic coarse and fine decomposition of a complex shape for use with finite element modeling.

The invention can be summarized as a fine element decomposition method included within a computer aided design system in which a polygonal boundary of a domain is manually entered and the domain is divided into regions being associated with a closest straight line segment of the boundary or reflex vertex thereof. These regions are further adjusted to remove arc portions and then further divided so that all rough regions or elements are either triangles or trapezoids. These rough regions are paired across internal boundaries into four classes of rough elements. In the fine decomposition, the triangles and trapezoids are further subdivided into fine elements, preferably triangles, according to rules associated with each of the classes. The amount of subdivision can be related algebraically to the total number of fine elements.

With the generated fine elements, difference equations are solved for a desired physical quantity extending over the domain and the quantity is then displayed over the extent of the domain to the analyst, who may repeat the operation with a readjusted boundary.

BRIEF DESCRIPTION OF THE DRAWINGS

FIGS. 6, 7, 8 and 9 illustrate the fine decomposition for the four classes of rough elements.

FIGS. 10, 11 and 12 illustrate three types of sliver removal.

DETAILED DESCRIPTION OF THE PREFERRED EMBODIMENTS

Figure 1:
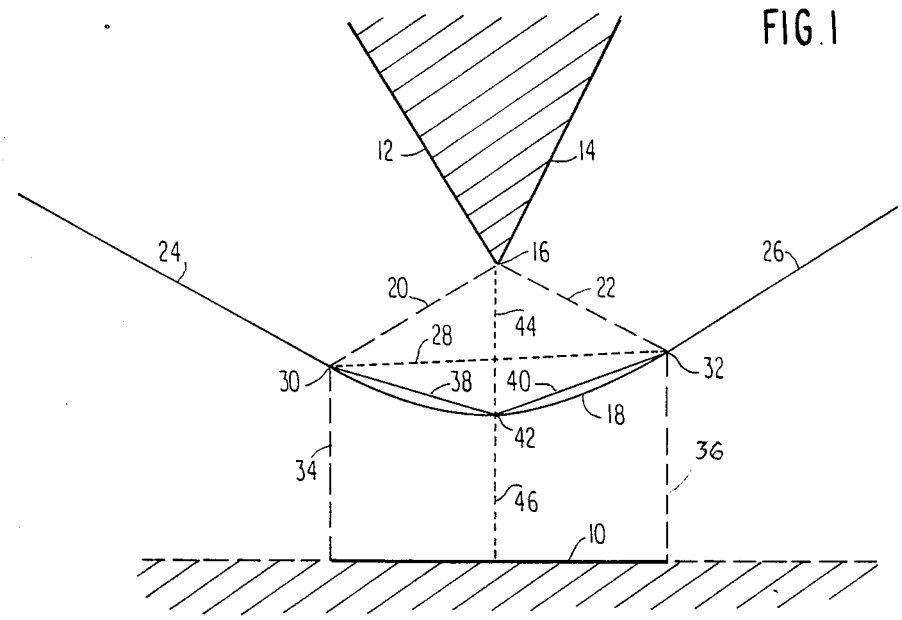
FIG. 1 is an introductory diagram illustrating division of bisectors and straightening of Voronoi diagrams.

In a computer aided design (CAD) station, the user is able to easily enter a desired shape or modify a previously entered shape by simple and quick means such as a computer mouse. Once the shape has been so entered, the finite element decomposition begins. The results of the decomposition may be displayed on an associated CRT but such a display is not required. Then the finite element form of the differential equations are solved. Usually, the results of the solution are displayed in continuous fashion over the domain of the entered shape. For instance, a temperature distribution or electric field distribution may be displayed. The CAD operator inspects these displayed results and, if he considers them to be less than optimal, he modifies the previously entered shape and repeats the process. In this way, he iterates to a better design.

According to the invention, if the boundary of a two-dimensional multiply-connected polygonal domain is given, the decomposition covers the interior of the domain with N non-overlapping triangles such that any two triangles are either disjoint or intersect along an entire triangle edge or at a single vertex. The triangle vertices are called nodes. The triangles should also satisfy the additional criteria that: (1) the triangles should be nearly equilateral; and (2) the node density per unit area should increase in places where the shape changes.

The fine and coarse decomposition procedures will first be described in somewhat mathematical form so that proper definitions are available. Thereafter, more specific flow diagrams will be described.

The fine decomposition step is the major part of this invention but a coarse or rough decomposition step is performed first. That coarse decomposition will now be described.

The coarse decomposition may be accomplished according to an extension of the method disclosed in the patent application of Nackman and Srinivasan. There, it was described in terms of the symmetric axis transform. Here, the description is recast in the terminology of Voronoi diagrams, for consistency with a pair of technical articles by V. Srinivasan and L. R. Nackman entitled "Voronoi Diagram for Multiply-Connected Polygonal Domains I: Algorithm" and by S. N. Meshkat and C. M. Sakkas entitled "Voronoi Diagram for Multiply-Connected Polygonal Domains II: Implementation and Application", both appearing in the IBM Journal of Research and Development, Vol. 31, no. 3, May 1987 at pages 361-372 and 373-381 respectively.

Associated with each edge and reflex vertex of the domain boundary is a Voronoi region. Each Voronoi region consists of all points of the domain that are closer to that edge or vertex than to any other part of the domain boundary. The union of the closures (combination of the areas) of the so generated Voronoi regions covers the entire domain. The boundary of each Voronoi region consists of the edge (or the reflex vertex) itself and line segments and parabolic arcs that lie inside the domain. These line segments and parabolic arcs are called Voronoi edges and their overlapping or common end points are called Voronoi vertices. The union of the Voronoi edges and Voronoi vertices is called the Voronoi diagram of the domain. Each parabolic arc is then replaced by a straight line segment that joins its end points to thereby obtain a straightened Voronoi diagram, which is a planar straight-line graph. It can be easily shown that the straightened Voronoi diagram lies completely within the domain. The straightened symmetric axis is the subgraph of the straightened Voronoi diagram formed by deleting Voronoi edges that terminate at reflex vertices of the domain boundary. The straightened Voronoi regions are obtained from the original Voronoi regions by straightening the boundaries. Note that each straightened Voronoi region is bounded by a simple polygon so that all curved boundaries have been removed. Polygonal boundaries simplify the further decomposition.

The edges and vertices of the straightened symmetric axis graph will be called symax edges and symax vertices for brevity.

The coarse decomposition consists of the straightened Voronoi regions, that is, the Voronoi regions whose boundaries have been straightened. Note that each straightened Voronoi region is bounded by a simple polygon because the original domain was polygonal and because of the straightening of the Voronoi diagram.

The next step is to convert each straightened Voronoi region into one or more quadrilaterals and/or triangles. Each internal symax vertex is the center of a maximal disk that touches the domain boundary in two or more distinct points. That is, at each internal vertex, a disk is created which is just large enough to touch the external boundary. Because of the way in which the vertices were found, this disk will touch, without crossing, the boundary at at least two touching points. Touching radii are then added to the graph. These touching radii join the vertices to their associated touching points. With each Voronoi vertex, there are two or more touching radii linking that vertex to respective boundaries on either side of the symmetric axis. With the addition of the touching radii to the straightened Voronoi diagram, the entire domain is decomposed into triangles and quadrilaterals. Specifically, the quadrilaterals are trapezoids with two adjacent right angles. A different description of this same process of generating touching radii will be provided later.

If the angle formed by two adjacent touching radii incident on a reflex vertex of the domain boundary exceeds $\pi/2$ (90°), the associated symax edge is replaced with a chain of line segments of nearly equal length whose separate end points lie on the original parabolic arc or line segment in the unstraightened Voronoi diagram. The line segments are of such a length that the angle between any two adjacent touching radii is between $\pi/4$ and $\pi/3$ (45° to 60°).

Several of these steps are illustrated in FIG. 1 in which straight lines 10, 12 and 14 define the outer boundary of a domain. The boundary is continued in the dashed part of line 10. Other parts of the boundary are not illustrated. Four Voronoi regions are formed. The first region, associated with a reflex vertex 16 of the boundary, is bounded by the vertex 16, a parabolic arc 18 around that vertex 16, and further straight Voronoi edges, which are later replaced by touching radii 20 and 22. The second region, associated with the boundary line 12, is bounded by the boundary line 12, the Voronoi edge 20, and another Voronoi edge 24. The third, associated with the boundary line 14, is bounded by the boundary line 14, the touching radius 22 and another Voronoi edge 26. The fourth, associated with the bottom boundary line 10, is bounded on the top by the parabolic arc 18 and the two Voronoi edges 24 and 26 and on the bottom by the boundary line 10. The Voronoi edge constituted by the parabolic arc 18 is straightened into a symax edge 28 with a resultant redefinition of the straightened Voronoi diagram. The straightened symmetric axis is obtained by deleting from the straightened Voronoi diagram the Voronoi edges 20 and 22 touching the reflex vertex 16. There are two symax vertices 30 and 32 at this stage. The maximal disks drawn around the symax vertices 30 and 32 will both touch the bottom boundary line 10 and the reflex vertex 16 without crossing any of the boundaries. Therefore, touching radii 20, 22, 34 and 36 are added to the graph. The angle between the touching radii 20 and 22 and associated with the reflex vertex 16 of the boundary is more than $\pi/2$ as illustrated. Therefore, the symax edge 28 is replaced by two symax edges 38 and 40, the end points of all of which fall on the parabolic arc 18. The maximal disk associated with a new internal vertex 42 has two touching radii 44 and 46. The angles between neighboring touching radii 22, 44 and 44, 20 are close to $\pi/3$.

Figure 2:
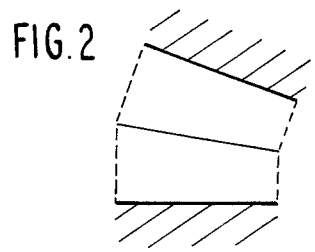
FIGS. 2, 3, 4 and 5 illustrate the four classes of rough elements generated in the rough decomposition.

Since the domain has been decomposed into triangles and trapezoids, each symax edge is shared either by two trapezoids, by two triangles, or by a triangle and a trapezoid. Note that a touching radius is not a symax edge. Such pairs separated by a symax edge can be further classified into four cases. In so far as possible in the following discussion, the illustrative convention will be followed that boundary edges are represented by heavy lines, symax edges are represented by light lines, and touching radii are represented by dashed lines. Any additional edges introduced by fine decomposition are represented by dotted lines. Any hashed area is outside of the domain. The four cases are:

(1) Two congruent right trapezoids, as illustrated in FIG. 2. That is, each of the right trapezoids have equal length corresponding sides. Further, each of the trapezoids has an edge which forms at least part of a domain boundary.

Figure 3:
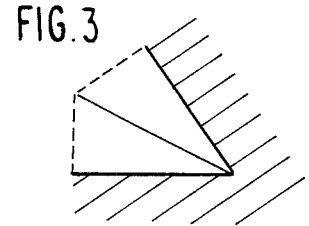

(2) Two congruent right triangles, as illustrated in FIG. 3. Further, each of the triangles has an edge which forms at least part of the domain boundary.

Figure 4:
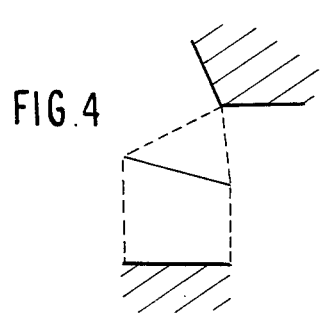

(3) A right trapezoid and a triangle, as illustrated in FIG. 4. The trapezoid has an edge which forms at least part of the domain boundary and the triangle has a vertex coincident with a reflex vertex of the domain boundary.

Figure 5:
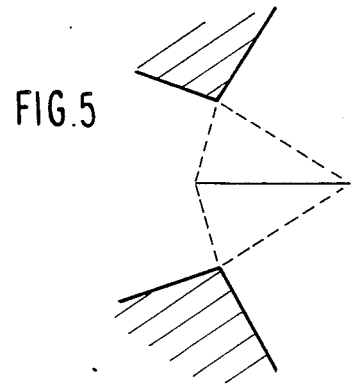

(4) Two congruent triangles, as illustrated in FIG. 5. Each of the triangles has a vertex coincident with a reflex vertex of the domain boundary. Note that these triangles are not necessarily right triangles.

The above triangles and trapezoids are the coarse elements formed in the coarse decomposition. Hereafter, the coarse elements will be further divided in the fine decomposition.

Fine decomposition of the trapezoidal and triangular coarse elements can be achieved by adding nodal points of the final mesh along the edges and in the interior of these coarse elements. Such nodal points can be added taking into account only the local geometry, provided that the added nodal points along the overlapping edges of adjacent coarse elements are the same. Maintaining such compatibility across the boundary edges is extremely important in any finite element decomposition. Compatibility is here achieved by treating together a pair of adjacent coarse elements of the classes described above. Note that the boundary between two coarse elements cannot overlap any portion of the domain boundary. Therefore, we need consider only the touching radii and the symax edge shared by the two coarse elements in each pair. Compatibility across a symax edge is handled explicitly while treating each pair of the coarse elements that share the symax edge. Compatibility across a touching radius is guaranteed by adding the same number n of nodal points along all radii.

The fine decomposition will be performed according to four sets of rules appropriate for each of the four classes of pairs previously defined. In each case, an aspect ratio will be defined which provides guidance in adding nodes only where it is necessary. Included with the rules will be a computation on an upper bound for the number of triangular finite elements generated in each pair. This upper bound will be a quadratic function of n and the local geometric parameters of the coarse element. Such numbers provide the capability of roughly determining the total number of finite elements of the number n. By equating this total number of finite elements with a user specified limit (often related to computer time and resources during the finite equation solution procedure), a solution for n can be found. That is, based on the rough decomposition, the degree of fine composition can be controlled to conform to the limits of the calculation done on the finite elements.

Case 1: Two Congruent Right Trapezoids

An example of the right trapezoid described above is illustrated in FIG. 6. This trapezoid PQQ'P' has one edge PQ which is the symax edge separating it from the paired congruent trapezoid. It also has an edge Q'P' which is on the boundary of the domain which was initially divided by rough composition. The other trapezoid of the pair is handled by symmetry since it is congruent. With a value of n chosen, place n equally spaced nodes 50 and 52 on each of remaining edges QQ' and PP' of the trapezoid. In the illustration, n is set to three. Such nodes 50 and 52 produce n+1 equal segments 54 and 56 of respective lengths p and q. There are two possibilities.

If the length PQ is greater than or equal to p+q, then the following is performed. Create two line segments 58 and 60 of respective lengths p and q, also illustrated as PA and QB. Construct perpendiculars 62 and 64 from the domain boundary Q'P', also illustrated as AA' and BB'. Divide these perpendiculars 62 and 64 into equal intervals with (n−1) nodes. Finally, triangulate each of the trapezoids PAA'P' and QBB'Q' into (2n+1) triangles using the previously added (2n−1) nodes. The triangulation will begin at one end of the perpendicular 62 or 64, proceed to the nearest 50 or 52 node on the edge QQ' or PP' and thereafter alternate between these nodes and those on the perpendiculars 62 and 64 before ending up at the other end of the perpendicular 62 or 64 or the edge QQ' or PP'. If n has already been reduced to zero, then there are no nodes and the triangulation is performed from the opposing ends of the two vertical edges to complete the triangulation process. Thereafter, the trapezoid ABB'A' is treated as the trapezoid and the process described above is repeated with the value of n reduced by one. However, the value of n is never decremented to less than zero. In the rough element illustrated in FIG. 6, this addition of nodes is repeated twice. It is noted that on the second and subsequent iterations nodes on the outside vertical edges have been created in the prior iteration.

On the other hand, if the length PQ (or equivalent length in subsequent iterations) is less than p+q, then triangulate the trapezoid into 2(n+1) triangles using the previously added nodes. This provides a termination condition for the iteration.

If a trapezoid aspect ratio is defined to be 2P'Q'/(PP'+QQ'), then the total number of triangles $N_1$ generated in this case for the two trapezoids is bounded by ceil(4Q(n+1)) using the original value of n. The function "ceil" is the round up function for a floating point number, that is, the next highest integer.

Case 2: Two Congruent Right Triangles

An example of one right triangle RR'S is illustrated in FIG. 7. The edge RS is the symax edge and R'S is on the boundary of the original polygon. Place n equally spaced nodes 66 on RS, n equally spaced nodes 68 on RR', and n equally spaced nodes 70 on R'S. Then triangulate by constructing three families of mutually parallel lines, each obtained by joining corresponding pairs of nodes. The other triangle, congruent with the illustrated triangle, is handled by symmetry. This procedure produces a number $N_2=2(n+1)^2$ of elements for the two right triangles.

Case 3: A Right Trapezoid and a Triangle

A triangle TUV and a right trapezoid UVV'U' are illustrated in FIG. 8, with the triangle and trapezoid separated by a light line. The line UV is the symax edge and the vertex T of the triangle falls on the boundary of the original polygon. For the trapezoid UVV'U', place n respectively equally spaced nodes 72, 74, 76 and 78 on edges UV, UU', U'V', and VV'. The trapezoid is then triangulated by constructing families of connecting nodes. The first family extends from the nodes 76 on the edge U'V' to the corresponding nodes 72 on the opposing edge. The second family extends between the nodes 74 and 78 on the remaining edges UU' and VV'. There results (n+1)² quadrilaterals. These quadrilaterals are then each divided by a single diagonal, resulting in the triangulation of the trapezoid UVV'U'. The triangle TUV is then handled according to the rules of Case 4, described below which are similar to those of Case 2.

This procedure produces elements of number $N_3=3(n+1)^2$ for the trapezoid and triangle.

Case 4: Two Congruent Triangles

A triangle WXY is illustrated in FIG. 9 which is one of a congruent pair. The edge WX is the symax edge and the vertex Y falls on the boundary of the original polygon. The other triangle of the pair is handled by symmetry. In this case, place n nodes 80, 82 and 84 on each of the edges WX, XY, and WY. Then triangulate by constructing three families of parallel lines, each obtained by joining pairs of corresponding nodes. This procedure produces in the two triangles elements of number $N_4=2(n+1)^2$.

Sliver Removal

Long and thin finite elements should be avoided wherever possible in a finite element decomposition technique. Such long, thin elements will here be referred to as slivers. However, they are unavoidable if the given domain itself subtends very small angles at the boundary vertices. In other places, it is still possible to end up with long, thin triangles. A method for removing slivers will here be described.

The sliver removal process considers any triangle or trapezoid to be a sliver producer if its further decomposition yields "bad" triangles. An aspect ratio, defined below, is used to determine whether a triangle or trapezoid is a sliver producer. Subject to certain constraints, the user can choose a minimum acceptable aspect ratio.

The aspect ratio of a triangular coarse element will be defined as the ratio of the length of the triangle along the symax edge to the length along the touching radius. If this ratio is larger than unity, then the inverse of this ratio is used as the aspect ratio. When more than one edge of the triangle is a touching radius, use the average of their lengths.

Sliver removal is accomplished by identifying certain vertices and collapsing certain edges and elements. An additional constraint is imposed that the original domain boundary vertices are retained. This last constraint means that if the sliver removal demands moving the original boundary vertices (and thus the boundary itself), the sliver will be retained. The sliver removal may involve replacing two adjacent symax edges by one edge that connects the unshared end points. This replacement of adjacent symax edges will be attempted only if the new edge lies completely in the domain.

As should be evident from the above described fine decomposition of coarse elements in the form of triangles, as described for Cases 2 and 4, the resulting fine triangles are proportional to the coarse triangles. Therefore, the aspect ratio of the fine elements is the same as that of the coarse elements in the case of triangles. The coarse element is a sliver producer if its aspect ratio is too small.

Case 2 of two adjacent and congruent right triangles arises from an acute vertex 88 of the original boundary, as illustrated in FIG. 10, where two sliver producing triangular regions are bounded by two boundary segments 90 and 92, two touching radii 94 and 96 and a symax edge 98. The sliver removal in this case involves identifying nodes 100 and 102 associated with the two sliver producing triangles and collapsing edges and elements to join the triangles with neighboring regions. In this case, the touching radii 94 and 96 are removed by collapsing them in the direction of the illustrated arrows until they coalesce at the symax edge 98.

Case 4 of two adjacent congruent triangles arises from two reflex vertices 104 and 106 of the original boundary facing each other, as illustrated in FIG. 11. Here, the two sliver producing triangles are bounded by four touching radii 108, 110, 112 and 114 and a symax edge 115. In this case, sliver removal involves identifying corresponding nodes of each triangle along adjacent touching radii, here touching radii 108, 110 and 112, 114 and then collapsing edges and elements. Here, the touching radii 110 and 114 are collapsed to corresponding touching radii 108 and 112, as indicated by the arrow in FIG. 11.

In Case 1, the two trapezoids are formed between two straight boundary segments. The two trapezoids, as illustrated in FIG. 12 are bounded by boundary segments 116 and 118, a symax edge 120 and four touching radii 122, 124, 126 and 128. Each trapezoidal coarse element is decomposed into triangles. In order to attempt to prevent slivers, it is attempted to achieve aspect ratios close to unity by creating segments on the symax edge that are of the same length as the segments created on the closest touching radius. Triangular slivers arise when the previously defined trapezoidal aspect ratio $\Gamma$ is too small. It may be possible to obtain acceptable triangulation without sliver removal if n is sufficiently large. Otherwise, sliver removal is accomplished by identifying corresponding nodes along adjacent touching radii, here touching radii 122, 124 and 126, 128, and collapsing edges and elements in the directions of the illustrated arrows so that those nodes coalesce.

Case 3 includes both a triangular coarse element and a trapezoidal coarse element. If the aspect ratios are small, then sliver removal identifies corresponding nodes along adjacent touching radii and collapses edges and elements.

The choice of a minimum aspect ratio is constrained by a desire not to replace a sliver that is long in the radial direction by a sliver that is long in the symax direction. It can be shown that if the user-specified minimum aspect ratio is less than the golden ratio (the square root of 5 less 1 and divided by 2, that is, 0.618), no new slivers are introduced.

The above described method for fine decomposition of coarse elements of multiply-connected polygons has several advantages. The user can specify an upper bound on the total number of fine elements generated. This bound is important because solution time in the difference equations grows as the cube of the number of nodes, which, in this case, is proportional to the number of elements. The mesh produced exploits symmetries of the domain geometry and does not depend on the orientation of the shape with respect to a coordinate system. Therefore, similar geometries yield similar fine elements regardless of their relative locations in the part. Finally, slivers can be removed automatically. Slivers had been a serious limitation of previous approaches using Voronoi diagrams in mesh generation.

Figure 13:
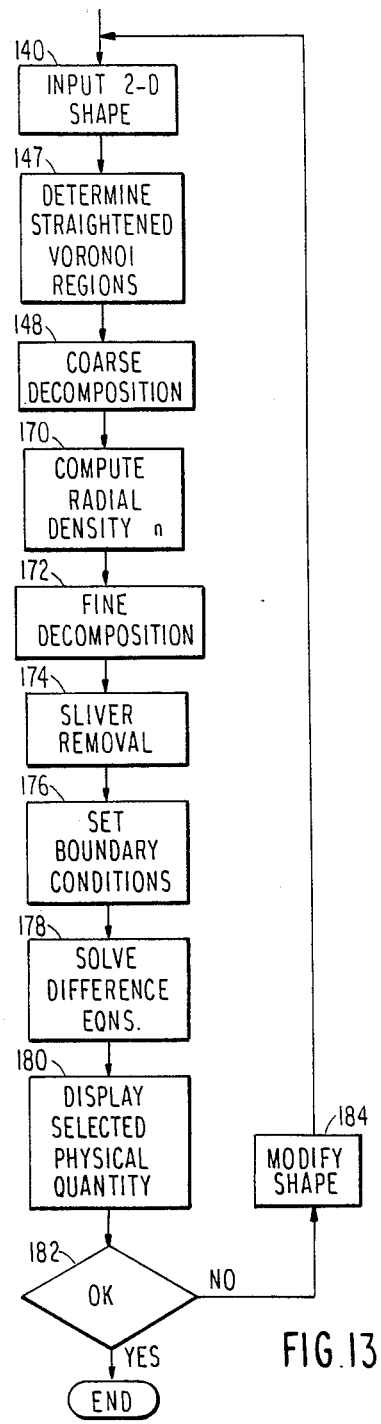
FIG. 13 is an overall flow diagram for the use of the invention in a computer aided design system.

The overall process of the method of this invention is illustrated in FIG. 13. The operator begins in step 140 by inputting a two-dimensional polygonal shape or domain, such as that illustrated in FIG. 14, which has not only an outer polygonal boundary 142 but also a polygonal hole 144 defined by an inner boundary 146. This shape entry can be done with a mouse or a joystick in a CAD machine in which the shape appears on the associated CRT while it is being drawn by the operator. The domain definition can be done by use of commercially available programs, such as either of two programs CATIA and CAEDS, available from the IBM Corporation, which allow the user definition of geometric shapes in terms understandable to a computer. The domain boundaries 142 and 146 are entered by moving the mouse or joystick until the cursor appears at the desired spot on the CRT which defines a vertex, illustrated by dots on the boundaries 142 and 146. The straight line segments of the boundaries 142 and 146 connect successively entered vertices.

Figure 14:
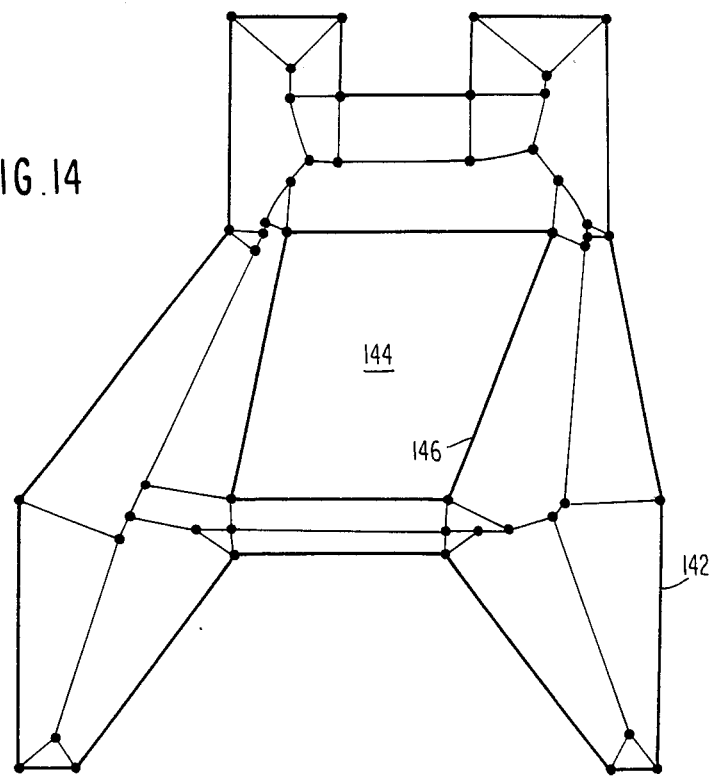
FIG. 14 illustrates Voronoi regions for a complicated shape.

Once a satisfactory shape has been entered, the operator notifies the computer to take over operation. In step 147, the computer determines the boundaries of the straightened Voronoi regions. The regions illustrated in the domain of FIG. 14 are the unstraightened Voronoi regions and thus constitute the original Voronoi diagram. The illustrated interior lines complete the Voronoi edges and the additional dots are the additional Voronoi vertices. As described previously, each straight line segment and each vertex of the polygonal boundaries have associated therewith a Voronoi region which is closer to it than to any other straight line segment or vertex of the boundaries. Although there may be other ways of determining the Voronoi regions, it is preferred to use the method described in the previously described technical article by Meshkat and Sakkas.

In step 147, if the angle of any parabolic arc about a boundary vertex (see FIG. 1) or of a linear bisector (see FIG. 5) between two such boundary vertices exceeds 90°, the arc or bisector is divided into two or three segments whose angles lie between 45° and 60°. Thereby, new Voronoi vertices are introduced on the parabolic arc or linear bisector. The final substep in step 147 is the straightening of the parabolic arcs linking neighboring Voronoi vertices. This straightening is accomplished by simply replacing the arc with a chord (straight line) connecting the two vertices, as described with reference to FIG. 1.

Figure 15:
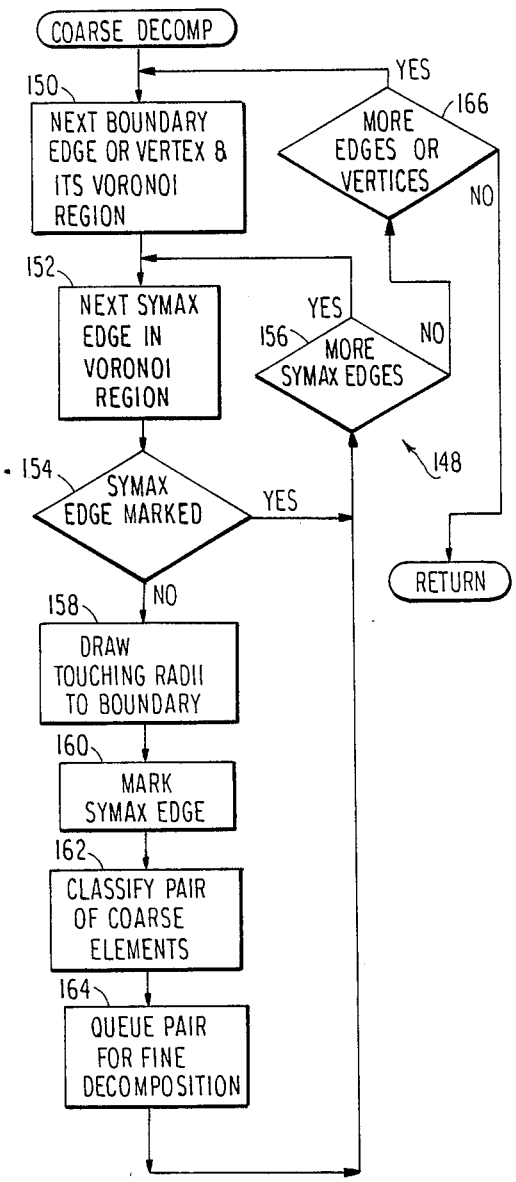
FIG. 15 is a flow diagram for the rough decomposition.

In step 148, the computer performs the coarse decomposition of the straightened Voronoi regions. This important step, upon the details of which the fine composition depends, is illustrated in more detail in FIG. 15. In step 150, the next boundary edge or boundary vertex along the boundary is selected. The selection should proceed in a given direction, for instance counter-clockwise, from a given starting position. With each boundary edge or vertex, there is associated therewith a straightened Voronoi region. If there are more than one such Voronoi regions because of the above described division of the arc or linear bisector, these separate Voronoi regions are considered sequentially in the same counter-clockwise direction.

In step 152, the next symax edge within the selected Voronoi region is selected for consideration. This symax edge selection proceeds in the same counter-clockwise direction from a given starting point. It is important to realize that symax edges, even of the straightened Voronoi diagram expanded by the arc division, are internal to the Voronoi diagram and do not touch the boundaries except at acute vertices thereof. Furthermore, they can each be associated with two boundary segments or vertices on opposing sides of the symax edges. In step 154, the determination is made as to whether the symax edge under consideration is marked, a designation to be described later. Initially, all symax edges are unmarked. Once a symax edge is marked, it stays marked even for consideration of other Voronoi regions. If the edge is marked, then the next symax edge is considered if a test in step 156 determines that a next symax edge exists.

If the symax edge is not marked, then in step 158 any touching radii are drawn from the two internal Voronoi vertices at the ends of the symax edge. Touching radii are drawn to the symax vertices when the resulting touching radii will be perpendicular to any boundary line segment defining a side of the two Voronoi regions on either side of the symax edge under consideration or will intersect a reflex boundary vertex of such Voronoi regions. The symax edge is then marked in Step 160. The coarse elements, triangular or quadrilateral, on either side of the symax edge and possibly defined by the touching radii at the ends of the symax edge are classified in step 162 into one of the four cases represented in FIGS. 2, 3, 4 and 5. These pairs of rough elements are then queued for the fine decomposition in step 164. The marking effectively removes these rough regions from further consideration. The next symax edge is then considered. If at any time, there are no more boundary edges or vertices to be considered, as determined by test 166, the rough decomposition is completed with the queuing of all rough elements.

The next step 170 in FIG. 13 is the computation of the radial density n, that is, the number of nodes to be used in the touching radii subdivision in the fine decomposition. The finite difference calculation is limited to a number N of elements, because of limitations such as memory or machine time. For each of the queued pairs of rough elements, there is associated therewith a classification into the four cases and at least an upper bound on the produced number of fine elements for that case, dependent upon n. These numbers of elements, represented by $N_1$ through $N_4$ in the prior description are then summed for the paired roughed elements in an algebraic expression which is set equal to N. This expression is then solved for n. Any fractional part of n is discarded.

The above description concerns an automatic generation of the radial density n. However, the analyst may decide that the automatically generated value of n is unsatisfactory for different reasons. He retains the capability of setting a desired value of n.

In step 172, the computer performs the fine decomposition with the set value of the radial density n. Each of the queued pairs of rough elements are processed according to their classification in the four cases previously described. This fine decomposition involves at least dividing each touching radius of the triangle or trapezoid into (n+1) sub-segments with new vertices therebetween. With these new vertices, the fine decomposition of the pairs is performed as previously described according to the pair classification.

Figure 16:
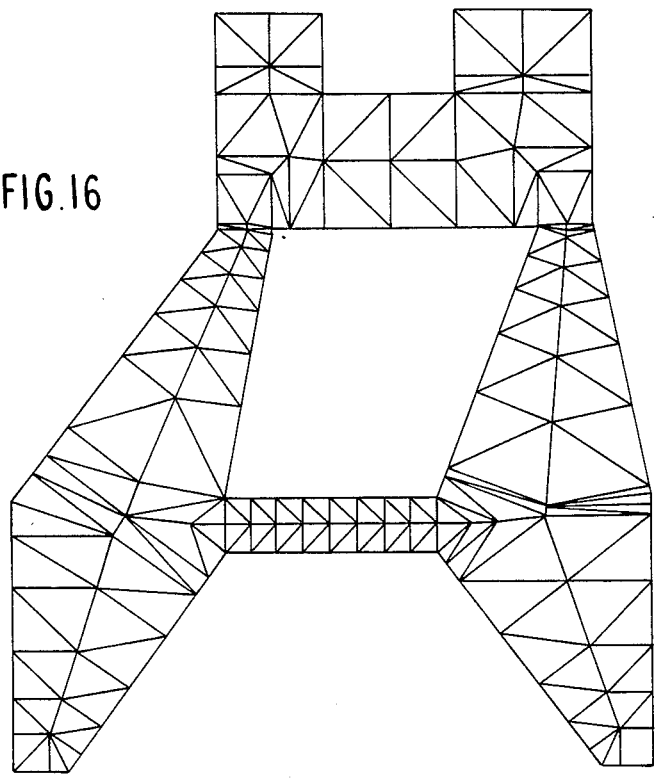
FIG. 16 illustrates fine elements for the shape of FIG. 14 before sliver removal.
Figure 17:
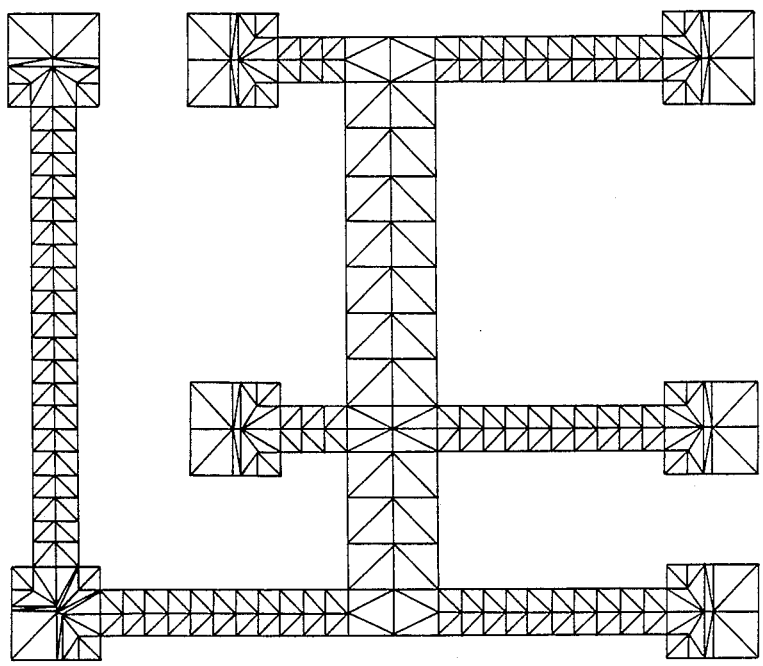
FIG. 17 illustrates fine elements for another complicated shape before sliver removal.

Two examples of fine decomposition prior to sliver removal are illustrated in FIGS. 16 and 17. The fine elements of FIG. 16 were derived from the Voronoi regions of FIG. 14. A close inspection of FIGS. 16 and 17 show the existence of slivers.

In step 174, sliver removal is performed. For each pair of coarse elements, the aspect ratio Γ is calculated as the length of the symax edge divided by the average of the touching radii. In case 1, this ratio is further divided by (n+1). If the ratio is greater than one, then the aspect ratio is inverted. If the aspect ratio is less than a minimum acceptable value, the fine elements in this pair of coarse elements are collapsed and corresponding vertices are replaced, as has been previously described. However, the collapsing is performed only when the resulting new edge completely lies in the interior of the domain.

Figure 18:
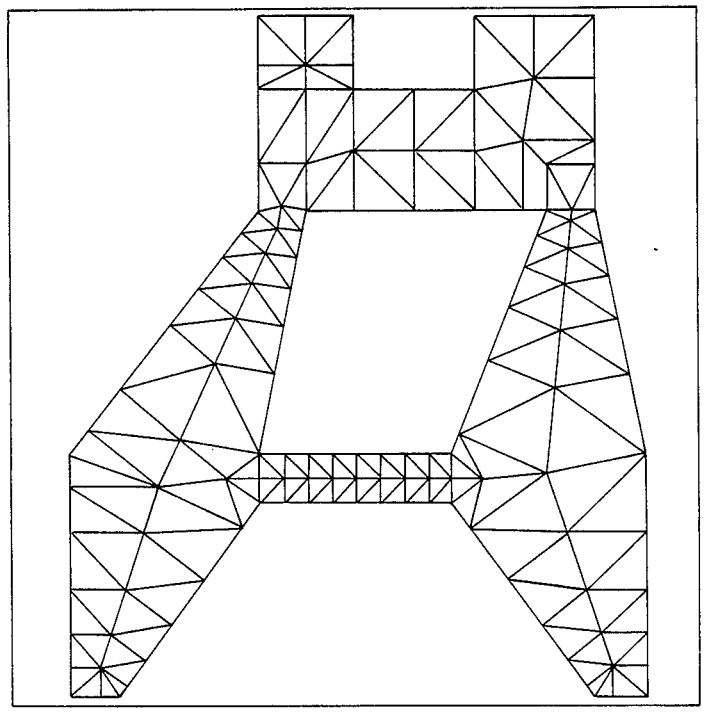
FIGS. 18 and 19, corresponding to FIGS. 16 and 17 respectively, illustrate fine elements after sliver removal.
Figure 19:
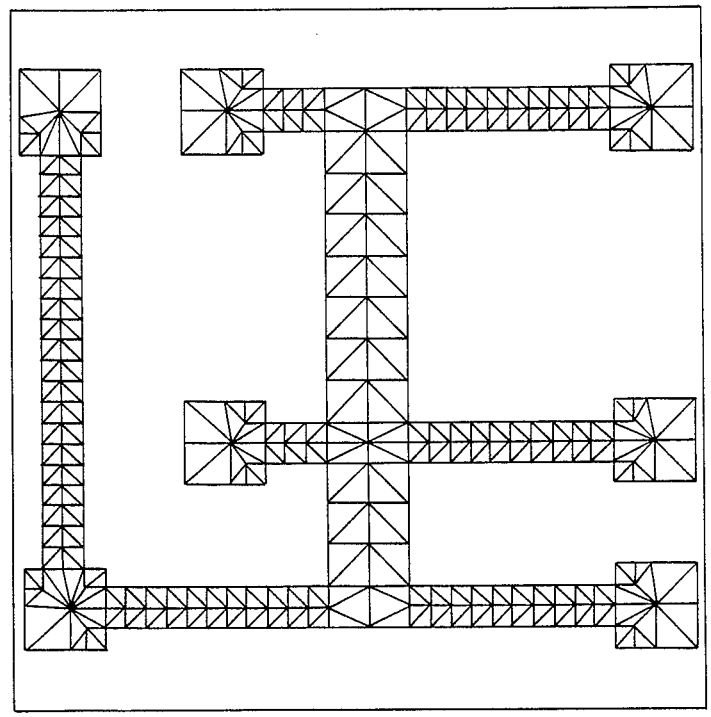

The examples of FIGS. 16 and 17 are further illustrated in FIGS. 18 and 19 after the removal of the slivers. The overall result is gradually varying fine elements of size commensurate with the dimensions of that part of the domain. It is noted that the originals of FIGS. 16 through 19 were automatically produced by a graphic means receiving outputs of the automatic finite element generation means of the invention.

The above steps complete the generation of the finite elements. The analyst may desire at this point to display the fine mesh on the CRT of the CAD machine. However, this is not necessary. The CAEDS program provides for the display of such a mesh.

The so generated finite elements can be used in a finite element calculation of approximate solutions for any number of partial differential equations in order to predict physical quantities. Such calculation, examples of which appear below, are fully described by Zienkiewicz in his book "The Finite Element Method," 3rd., published by McGraw-Hill Book Co., London, 1982. That reference fully describes the finite element forms of various important partial differential equations.

A well known, commercially available finite element solver is the NASTRAN program, available from the MSC Corporation.

Poisson's equation is used for calculations of heat conduction through a body, that is, of heat flow and the resultant temperature distribution. Heat sources and heat sinks impose boundary conditions on the differential equation.

The bi-harmonic equation is used for calculations of stress analysis in a body. Externally applied loads form the boundary conditions.

The Navier-Stokes equation is a generalized equation for the calculation of fluid flow, both its direction and rate, through a body. The fluid can be either compressible or incompressible. There are usually fluid sources and fluid sinks determining some of the boundary conditions.

Maxwell's equations are used in calculating electromagnetic fields, principally electric and magnetic fields or their associated potential, within a body. In some situations, the electric and magnetic fields can be decoupled.

The diffusion equations are used for a variety of diffusion phenomena, such as semiconductor transport, within a body. The diffusing field may be identifiable particles, such as electrons, or may represent more abstract field-like quantities. Once again, there may be a diffusion source and a diffusion sink at the boundaries.

The boundary conditions for any surface of the body need to be determined for the calculation. For instance, in electromagnetic calculations, a different boundary condition is imposed on an insulating boundary than on a conducting boundary. Likewise, as mentioned above, sources and sinks are often simulated at part of the boundary of the body.

The CAEDS program provides for the setting of the boundary conditions although a simple program can be devised for the entry of the boundary conditions.

Sometimes, the body is considered to have uniform characteristics, such as bulk resistivity for current flow, but it may be possible to provide for a non-uniform body by assigning a different value of, for instance, resistivity to each of the generated finite elements.

The calculations with finite elements are not however limited to the above equations or phenomena but are limited only to the prediction of physical quantities which are described by a partial differential equation valid within a body.

Returning to FIG. 13, the prediction is performed by setting in step 176 the boundary conditions of the body along with any sinks, sources and internal characteristics of the body. Then in step 178, the resultant finite difference difference equations, using the generated fine elements, are calculated by the computer.

In the interactive process between the CAD system and the analyst, it is usually necessary to display on a CRT a two-dimensional representation of a selected physical quantity. Once again, the CAEDS program allows the display of the selected physical quantity. The physical quantity is usually displayed in conjunction with a display of the domain boundaries so that the analyst can associate the calculated values of the physical quantity with identifiable parts of the domain.

The selected physical quantity may possibly not be the quantity directly calculated by the finite difference equations. For instance, electrical current flow through a resistive solid is often based on a calculation of electrical potential and the gradient of the potential is then derived to provide the current. Once the desired physical quantity has been obtained, it is displayed on a CRT or other graphic display means in step 180 for the analyst's benefit.

If the analyst decides in step 182 that the simulation has produced acceptable results, the design is completed. However, if the analyst decides that the displayed physical quantity demonstrates an unacceptable design, then he must modify the shape of the domain in step 184 and repeat the entire process. Examples of unacceptable designs of the domain are excessive temperatures or stress at localized portions of the domain. Although it would be theoretically possible to automate steps 182 and 184, in most CAD applications, the analyst retains control over this decision making process and modifies the shape to alleviate local problems.

Figure 20:
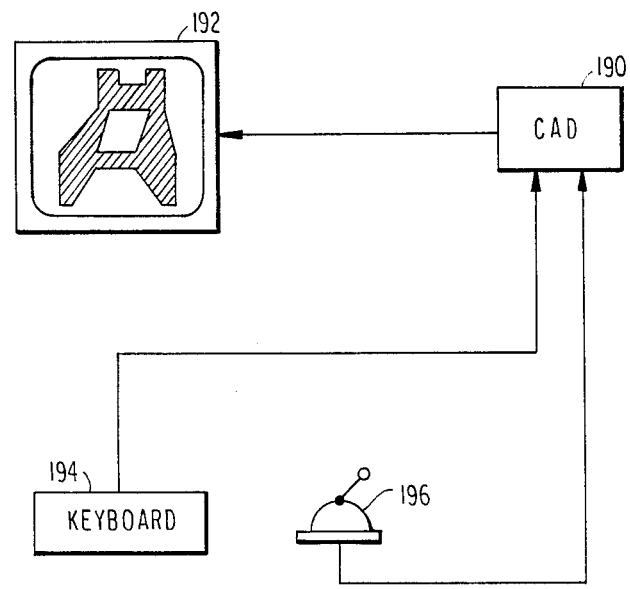
FIG. 20 is a block diagram illustrating a computer aided design system with which the invention is usable.

An operational system for practicing the invention is illustrated in FIG. 20 and principally constitutes a CAD (computer aided design) system 190. Such a CAD system 190 is a programmable computer already provided with the software for solving the difference equations. A preferred configuration for the CAD system 190 is to use a work station, such as the RT/PC available from the IBM Corporation, which is connected to a 370 type of host computer, such as the 3090 Series IBM computer. Associated with the CAD system 190 is a CRT (cathode) ray tube) 192 for the display of two dimensional shapes. The analyst controls the CAD system 190 with a keyboard 194 and a joystick 196 or equivalent mouse. The joystick 196 is particularly used for inputting the boundary of the domain which is immediately displayed on the CRT 192. The keyboard preferably is equipped with a series of dials which allow for easy adjustment of the displayed image, such as rotation. The CAD system 190 is additionally programmed with the rough and fine decomposition methods of the invention. Whether the various programs are resident on the RT/PC or the host computer depends on the capacity of the work station and the desired speed of computation. However, it has been found that the mesh can be generated in less than five seconds on the RT/PC. Internal to the CAD system 190, either in the work station or the host computer, is a memory which holds data between major steps of the method of FIG. 13, particularly the mesh definition of steps 172 and 174 which is used in the finite difference solution of step 178. This mesh definition would be the nodes of the mesh connected by straight line segments.

When the analyst has entered the desired polygonal boundary into the CAD system 190, he initiates the course and fine decomposition. If he desires, he can display the fine elements on the display 192 before the CAD system is instructed to solve the difference equations. The analyst may then manipulate the direct results of the difference equation solution to display desired physical quantities on the CRT 192. If he decides a redesign is necessary, he adjusts the domain boundaries with the joystick 196 through the use of the CATIA or CAEDS program and the process is repeated.

What is claimed is:

1. A method of generating a multiple polygonal representation of a predicted physical phenomenon, said method being of the type wherein information regarding a polygonal domain of a multi-dimensional object is entered into a computer, the information is processed by said computer and the representation is generated in accordance with the results of said processing, said method being characterized in that said step of processing said information by said computer comprises the steps of:
    dividing said domain into a plurality of first regions, at least one of which has a boundary which includes a curved portion, each said first region touching a boundary of said domain at at least a point;
    replacing said curved portion with at least one straight line connecting ends of said curved portion, thereby adjusting said first regions, whereby said adjusted first regions are bounded on all sides by straight line segments;
    classifying pairs of said adjusted first regions separated by a common boundary into a finite number of classes; and
    dividing each of said first regions into second regions according to a rule proper to its class, said second regions being used in generating said representation.

2. A method as recited in claim 1, wherein said adjusted first regions consist of triangles and right trapezoids and wherein there are four of said classes.

3. A method as recited in claim 2, wherein each said common boundary touches said boundary of said domain at at most an acute corner thereof.

4. A method as recited in claim 1, further comprising displaying said representation.

5. A method as recited in claim 4, wherein responsive to said displaying step new information regarding an adjusted polygonal domain is entered.

6. A computerized method of analyzing at least one physical condition across a domain, said domain being bounded by one or more polygonal boundaries composed of straight line segments with vertices between adjacent ones thereof, some of said vertices possibly being reflex vertices with respect to an interior or said domain, said method comprising the steps of decomposing said domain via computer processing into a plurality of finite elements, analyzing said condition across each of said finite elements to obtain finite element analysis results, combining a plurality of said finite element analysis results to obtain a domain analysis result and providing a physical representation of said domain analysis result, wherein said step of decomposing said domain comprises the steps of:
dividing said domain into a plurality of first regions, each of said first regions being closer to a respective one of said line segments and said reflex vertices of said boundaries than to any other of said line segments and said reflex vertices of said boundaries, said first regions filling said domain, wherein said first regions are divided by first lines not touching said boundaries, by straight second lines touching said boundaries at vertices thereof other than said reflex vertices and by straight third lines touching said reflex vertices of said boundaries, said first lines consisting of further straight second lines and arc portions;
replacing said arc portions with further straight second lines which are straight lines connecting respective ends of said arc portions, said first regions being adjusted by said replacing step, all of said second lines being connected at internal vertices;
dividing said first regions by further straight third lines extending from said internal vertices to intercept said line segments at a right angle or to touch said reflex vertices, whereby each of said first regions after said dividing is bounded by two of said third lines;
classifying each pair of said divided first regions separated by a second line into one of four classes, a pair of a first class being two congruent right trapezoids, a pair of a second class being two congruent right triangles, a pair of a third class being a right trapezoid and a triangle, a pair of a fourth class being two congruent triangles; and
dividing each said triangle and trapezoid into second regions according to a rule proper to its class to obtain said finite elements.

7. A method as recited in claim 6, wherein said second regions are triangles.

8. A method as recited in claim 6, further comprising manually inputting said boundaries and providing visual feedback of said inputted boundaries.

9. A method as recited in claim 8, further comprising visually displaying said second regions and boundaries thereof.

10. A method as recited in claim 8, wherein said physical condition is represented by one or more difference equations extending over said domain and wherein said step of providing a physical representation of said domain analysis result comprises visually displaying a solution of said difference equations extending over said domain.

11. A method as recited in claim 10, further comprising changing said boundaries in response to said visual displaying of said solution of said difference equations and repeating steps of said decomposing method.

12. A method as recited in claim 6, wherein said decomposing step further comprises the steps of:
determining a number of second regions formed by said step of dividing said each triangle and trapezoid for each of said pairs of divided first regions as a function of a density variable, said density variable being contained in all of said proper rules;
summing said numbers to form an algebraic sum;
comparing said algebraic sum with a maximum element number;
solving said compared algebraic sum for said density variable; and
dividing said triangles and trapezoids according to said proper rules evaluated according to said solved density variable.

13. A method as recited in claim 12, wherein said second regions are triangles and said step of dividing said triangles and trapezoids comprising dividing said third lines into sub-segments of a number equal to said density variable plus one, said second regions having said sub-segments as a side.

14. A method as recited in claim 6, wherein said step of decomposing further comprises the step of collapsing at least some of said second regions which are contained in a first region having an aspect ratio of lengths of sides thereof falling outside a predetermined range.

15. A computer aided design system, comprising:
a display (192);
manual boundary input means (194, 196) for inputting at least one polygonal boundary to be displayed on said display, said at least one polygonal boundary bounding a domain and being composed of straight line segments with vertices between adjacent ones thereof, some of said vertices possibly being reflex vertices with respect to an interior of said domain;
first decomposition means (190, 148, FIG. 15) for decomposing said domain into a plurality of large triangular and trapezoidal regions each touching said boundary, pairs of said large regions separated by a common edge being classified according to a finite number of classes; and
second decomposition means (190, 172) for decomposing each of said large regions into a plurality of small regions according to a rule proper to its class.

16. A system as recited in claim 15, wherein said first and second decomposition means comprise:
means (190, 147) for dividing said domain into a plurality of first regions, each of said first regions being closer to a respective one of said line segments and said reflex vertices of said boundary than to any other of said line segments and said reflex vertices of said boundary, said first regions filling said domain, wherein said first regions are divided by first lines not touching said boundary, by straight second lines touching said boundary at vertices of said boundary other than said reflex vertices and straight third lines touching said reflex vertices of said boundary, said first lines consisting of further straight second lines and arc portions;
means (190, 147) for replacing said arc portions with further straight second lines which are straight lines connecting respective ends of said arc portions, said first regions being adjusted by said replacing means, all of said second lines being connected at internal vertices;
means (190, 158) for dividing said first regions by further straight third lines extending from said internal vertices to intercept said line segments at a right angle or to touch said reflex vertices, whereby each of said first regions after said dividing is bounded by two of said third lines;
means (190, 162) for classifying each pair of said divided first regions separated by a second line into one of four classes, a pair of a first class being two congruent right trapezoids, a pair of a second class being two congruent right triangles, a pair of a third class being a right trapezoid and a triangle, a pair of a fourth class being two congruent triangles; and
means (190, 172) for dividing each said triangle and trapezoid into second regions according to a rule proper to its class.

* * * * *